(12) United States Patent
Ju et al.

(10) Patent No.: US 6,992,910 B1
(45) Date of Patent: Jan. 31, 2006

(54) MAGNETIC RANDOM ACCESS MEMORY WITH THREE OR MORE STACKED TOGGLE MEMORY CELLS AND METHOD FOR WRITING A SELECTED CELL

(75) Inventors: Kochan Ju, Monte Sereno, CA (US); Oletta Allegranza, Monte Sereno, CA (US)

(73) Assignee: Maglabs, Inc., San Jose, CA (US)

( * ) Notice: Subject to any disclaimer, the term of this patent is extended or adjusted under 35 U.S.C. 154(b) by 13 days.

(21) Appl. No.: 11/185,331

(22) Filed: Jul. 20, 2005

Related U.S. Application Data

(63) Continuation of application No. 10/991,993, filed on Nov. 18, 2004, now Pat. No. 6,937,497.

(51) Int. Cl.
*G11C 7/00* (2006.01)
(52) U.S. Cl. ................. 365/130; 365/171; 365/173
(58) Field of Classification Search ............. 365/130, 365/171, 173, 134, 135
See application file for complete search history.

(56) References Cited

U.S. PATENT DOCUMENTS

| | | | |
|---|---|---|---|
| 5,408,377 A | 4/1995 | Gurney et al. | |
| 5,966,012 A | 10/1999 | Parkin | |
| 6,545,906 B1 | 4/2003 | Savtchenko et al. | |
| 6,714,440 B2 * | 3/2004 | Subramanian et al. | 365/158 |
| 6,760,266 B2 * | 7/2004 | Garni et al. | 365/209 |
| 6,801,415 B2 * | 10/2004 | Slaughter et al. | 360/324.2 |
| 6,831,312 B2 | 12/2004 | Slaughter et al. | |
| 2002/0036331 A1 | 3/2002 | Nickel et al. | |
| 2004/0012994 A1 | 1/2004 | Slaughter et al. | |
| 2004/0041183 A1 | 3/2004 | Slaughter et al. | |
| 2004/0120184 A1 * | 6/2004 | Janesky et al. | 365/158 |
| 2004/0125649 A1 | 7/2004 | Durlam et al. | |
| 2004/0246776 A1 | 12/2004 | Covington | |
| 2005/0047198 A1 | 3/2005 | Engel et al. | |

OTHER PUBLICATIONS

Reohr et al., "Memories of Tomorrow", IEEE Circuits & Devices Magazine, Sep. 2002, pp. 17-27.
Durlam et al., "A 0.18•m 4Mb Toggling MRAM", IEDM Technical Digest 2003, Session 34, paper #6.
Pugh et al, IBM J. of Res & Develop, vol. 4, No. 2, 163.

\* cited by examiner

*Primary Examiner*—Vu A. Le

(57) ABSTRACT

A "toggling" type of magnetic random access memory (MRAM) has memory stacks arranged in the X-Y plane on the MRAM substrate with each memory stack having a plurality of toggle memory cells stacked along the Z axis. Each memory stack is located at an intersection region between two orthogonal write lines. Each cell in the stack is a "toggle" cell that has its synthetic antiferromagnet (SAF) free layer easy axis of magnetization aligned nonparallel with the X and Y axes and angularly spaced about the Z axis from the easy axes of magnetization of all the other SAF free layers in the stack. Each cell in a stack is magnetically separated from adjacent cells in the stack by a nonmagnetic separation layer. The magnetization direction of the free layer in a selected memory cell in a stack can be switched without switching the magnetization directions of the free layers in the other memory cells in the stack.

16 Claims, 16 Drawing Sheets

Simple Ferromagnet

Synthetic Antiferromagnet (SAF)

MAGNETIC RANDOM ACCESS MEMORY WITH THREE OR MORE STACKED TOGGLE MEMORY CELLS AND METHOD FOR WRITING A SELECTED CELL

RELATED APPLICATION

This application is a continuation of application Ser. No. 10/991,993 filed Nov. 18, 2004, now U.S. Pat. No. 6,937,497.

BACKGROUND OF THE INVENTION

1. Field of the Invention

This invention relates generally to magnetic random access memory (MRAM) and more particularly to MRAM with "toggle" memory cells.

2. Description of the Related Art

MRAM with magnetic tunnel junction (MTJ) memory cells has been proposed for nonvolatile memory, as described in U.S. Pat. No. 5,640,343 and by Reohr et al., "Memories of Tomorrow", *IEEE CIRCUITS &DEVICES MAGAZINE*, September 2002, pp. 17–27. In these devices the MTJs are arranged as an array in a single layer (the X-Y plane) on a semiconductor substrate. In one type of architecture, called a 1T1MTJ MRAM (one transistor and one MTJ), each MTJ is located between a bit line and a transistor, with the word lines located beneath the MTJs. In another type of architecture, called a cross-point (XPC) MRAM, the MTJs are located directly between the bit and word lines.

In both MRAM architectures, a selected MTJ cell is programmed or "written", i.e., its magnetic state or +/−X magnetization direction is switched, by write currents passing in X and Y directions through the bit and word lines located above and below the selected MTJ. The write currents generate orthogonal magnetic fields in the X and Y directions that switch the magnetization direction of the selected MTJ. The typical writing scheme is a "half-select" scheme, where each of the bit and word lines generates half the required write field for switching the selected MTJ cell. However, the energized word and bit lines reduce the magnetic reversal energy barrier in the other cells along their respective word and bit lines. This makes these "half-selected" cells more susceptible to having their magnetic states switched when the selected cell is written.

An MRAM with a MTJ cell structure and switching mechanism that does not suffer from the half-select problem of the conventional MRAM has been proposed by Motorola. This "Savtchenko" cell structure and switching mechanism, named for its late inventor, is described in U.S. Pat. No. 6,545,906 B1 and M. Durlam et al., "A 0.18 $\mu$m 4 Mb Toggling MRAM", *IEDM Technical Digest* 2003, Session 34, paper #6. In this type of MRAM, the MTJ cell's ferromagnetic free layer is a synthetic antiferromagnet (SAF), i.e., a multilayer of two ferromagnetic sublayers of nearly identical magnetic moment, separated by an antiferromagnetic coupling layer that maintains an antiparallel alignment of the moments of the two sublayers. An SAF free layer in a spin-valve magnetoresistive sensor is described in U.S. Pat. No. 5,408,377, and an MTJ memory cell with SAF free and pinned layers is described in U.S. Pat. No. 5,966,012. The Savtchenko type of MRAM uses two orthogonal writing or programming lines, but with the MTJ cell's axis aligned 45 degrees to each of the lines. The SAF free layer responds to applied magnetic fields differently than a conventional single ferromagnetic free layer. Writing occurs by a process called "toggle" writing in which a two-phase programming pulse sequence incrementally rotates the SAF free layer moment or magnetization direction 180 degrees, so the MRAM is sometimes called a "toggling" MRAM and the memory cell a "toggle" cell. Because of the cell's 45 degree angle to the programming lines and its field response, the field from a single programming line cannot switch the magnetization of a half-selected cell, which results in an MRAM with enhanced cell selectivity.

The toggling MRAM is a single-memory-layer MRAM, i.e., all the toggle memory cells lie in substantially the same horizontal plane (the X-Y plane) on the substrate, so the storage density is necessarily limited. A toggling MRAM with specially-shaped toggle memory cells having multiple easy axes of magnetization and capable of more than two magnetic states has been described in published patent application US20040012994A1, but this MRAM is also a single-memory-layer MRAM.

What is needed is a toggling MRAM that does not require all the toggle memory cells to lie in the same plane, so that the storage density can be increased vertically, i.e., in the Z direction from the substrate.

SUMMARY OF THE INVENTION

The invention is a toggling MRAM with memory stacks arranged in the X-Y plane on the MRAM substrate with each memory stack having a plurality of toggle memory cells stacked along the Z axis. Each stack is located at an intersection region between the two orthogonal write lines. Each cell in the stack is a toggle cell that has its SAF free layer easy axis of magnetization aligned nonparallel with the X and Y axes and angularly spaced about the Z axis from the easy axes of magnetization of all the other SAF free layers in the stack. Each cell in a stack is magnetically separated from adjacent cells in the stack by a nonmagnetic separation layer.

The magnetization direction of the free layer in a selected memory cell in a stack can be switched without switching the magnetization directions of the free layers in the other memory cells in the stack. This is accomplished by selecting the write currents with an appropriate magnitude and direction so that magnetic write fields are applied to the selected cell in a particular direction and phase. If the easy axes of magnetization of all the free layers in the stack are equally angularly spaced about the Z axis, then selective writing of a selected cell is achieved by generating a write field in three pre-set directions using the two orthogonal write lines. Each write field is high enough to rotate the SAF free layer magnetization directions of the cells in a nearly perpendicular direction to the applied field, i.e., the spin-flop mode. During phase $t_1$, the write field is applied along a line approximately −θ degrees about the Z axis from the initial magnetization direction of the free layer of the selected cell, where 2θ is the angular spacing between the easy axes of magnetizations of the free layers in the stack. During phase $t_2$, the write field is applied along a line generally aligned with the initial magnetization direction of the free layer of the selected cell. During phase $t_3$, the write field is applied along a line approximately +θ degrees about the Z axis from the initial magnetization direction of the free layer of the selected cell. In phase $t_4$, the current in the two write lines is switched off and there is no write field. At this point, the magnetization direction of the free layer of the selected cell has rotated past its hard axis of magnetization and thus rotates to the new direction 180 degrees from its initial direction to complete the switching. The magnetization directions of the free layers of the other cells in the stack were not rotated past their hard axes of magnetization by any of the write fields, and thus rotate back to their original directions.

The easy axis of magnetization of the SAF free layer in each cell is the axis of anisotropy that can be induced by the shape of the cell or by the deposition process, such as deposition in an applied magnetic field or at an angle of incidence. If the anisotropy is induced during deposition, then the cells can have the same shape and matching perimeters, such as a circular shape. This allows the cells to be fabricated with the same lithographic patterning steps and permits the stacks to be packed closer together in the X-Y plane.

Each memory cell has an electrical resistance difference $\Delta R$ between the parallel and antiparallel alignment of its free and pinned layer magnetization directions. In one embodiment, the $\Delta R$ values of the cells in a stack are different, so that the individual magnetic state of each cell can be read by measuring the resistance across the stack. The $\Delta$ values of the cells can be made different by making the free layers with different ferromagnetic compositions and/or thicknesses. If the cells are magnetic tunnel junction (MTJ) cells, the $\Delta R$ values of the cells can be made different by fabricating the MTJ cells to have different tunnel barrier thicknesses.

For a fuller understanding of the nature and advantages of the present invention, reference should be made to the following detailed description taken together with the accompanying figures.

DETAILED DESCRIPTION OF THE INVENTION

Prior Art

Figure 1:
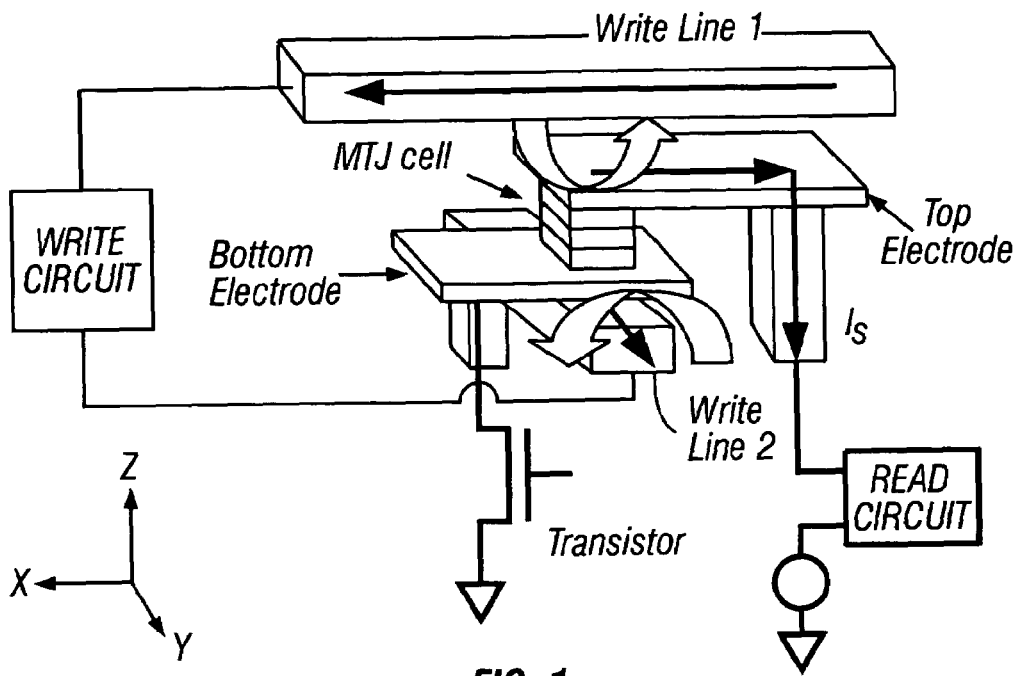
FIG. 1 is a perspective view of a portion of the prior art MRAM showing a single Savtchenko MTJ memory cell and associated write and read circuitry.

FIG. 1 is a perspective view of a portion of the prior art MRAM showing a single Savtchenko MTJ memory cell with a SAF free layer whose magnetization direction is switched by toggle writing. The MTJ cell is located in an intersection region between a second write line (WL2) (aligned along the Y axis) and a first write line (WL1) (aligned along the X axis). The write lines are connected to a write circuit that provides the sequence of current pulses to perform the toggle writing. Only one MTJ cell and intersection region is depicted in FIG. 1, but in the MRAM there are a plurality of generally parallel second write lines and a plurality of generally parallel first write lines that are orthogonal to the second write lines and overlap to define a plurality of intersection regions. Each intersection region contains an MTJ cell. Each MTJ cell is electrically connected to a transistor that is formed on the MRAM substrate (not shown). In the embodiment of FIG. 1 each MTJ cell is electrically connected to top and bottom electrodes that provide connection to the transistor and the resistance detection or read circuit. The magnetic state of the MTJ cell is read, i.e., the direction of the SAF free layer magnetization relative to direction of the pinned layer magnetization is detected, by turning on the transistor and measuring the resistance with the read circuit when a sense current $I_s$ flows through the MTJ cell.

Figure 2:
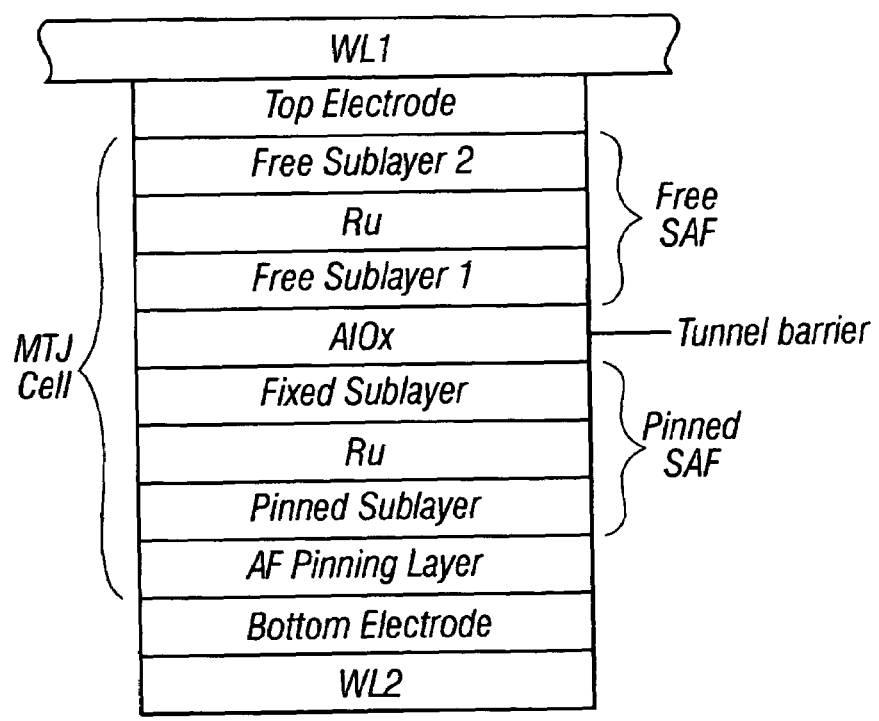
FIG. 2 is a sectional schematic showing the layers making up the prior art MTJ memory cell of FIG. 1.

FIG. 2 is a sectional schematic showing the layers making up the MTJ cell. An SAF free layer and an SAF pinned layer are separated by a tunnel barrier, which is typically formed of alumina ($Al_2O_3$). The SAF pinned layer is a trilayer of a pinned ferromagnetic sublayer and a fixed ferromagnetic sublayer spaced apart by an antiferromagnetic coupling (AFC) layer, which is typically ruthenium (Ru). The pinned sublayer of the SAF pinned layer is pinned by being antiferromagnetically coupled to an antiferromagnetic (AF) pinning layer, which is typically a Mn alloy, such as FeMn or PtMn. The pinned layer in the MTJ cell is preferably a SAF pinned layer but may be a conventional single ferromagnetic layer pinned to the AF pinning layer. The SAF free layer is a trilayer of first and second ferromagnetic sublayers spaced apart by an AFC coupling layer, which is typically ruthenium (Ru), with the magnetic moments of the two ferromagnetic sublayers being nearly balanced, but with the SAF free layer having a net magnetic moment or magnetization direction.

Figure 3A:
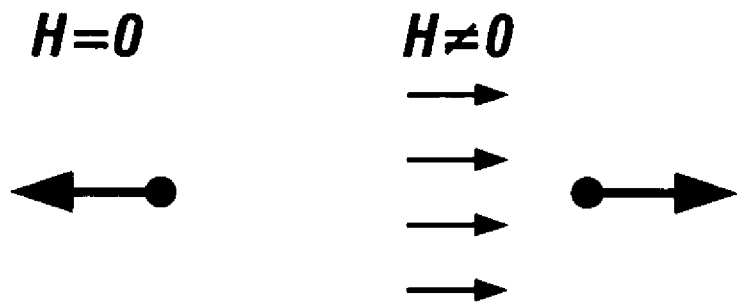
FIGS. 3A and 3B show a comparison of the magnetic field responses of a simple ferromagnet and a synthetic antiferromagnet (SAF), respectively.
Figure 3B:
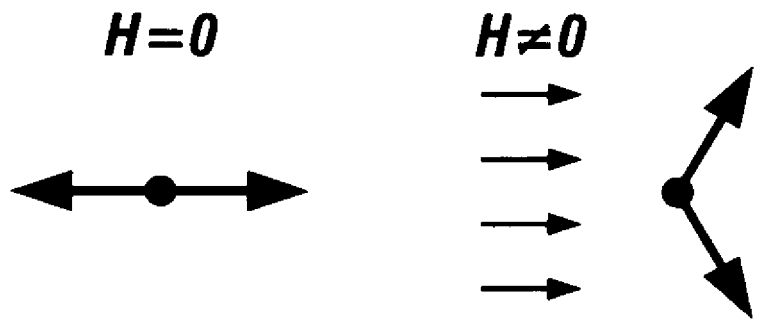

As shown in FIGS. 3A and 3B, the magnetic field response of an SAF is very different from that of a simple ferromagnet. The simple ferromagnet aligns with its magnetization direction, i.e., its magnetic moment, parallel to the applied field H, as shown in FIG. 3A. The nearly-balanced SAF, however, reaches the lowest energy by the spin-flop phenomenon which orients both moments of the two sublayers nearly perpendicularly to the applied field H, with a slight canting toward the applied field direction, as shown in FIG. 3B. The spin-flop phenomenon lowers the total magnetic energy in an applied field by rotating the magnetic moments of the two ferromagnetic sublayers so that they are nominally orthogonal to the applied field direction but still predominantly antiparallel to one another. The rotation, or flop, combined with a small deflection of each ferromagnetic magnetic moment in the direction of the applied field, accounts for the decrease in total magnetic energy.

Figure 4:
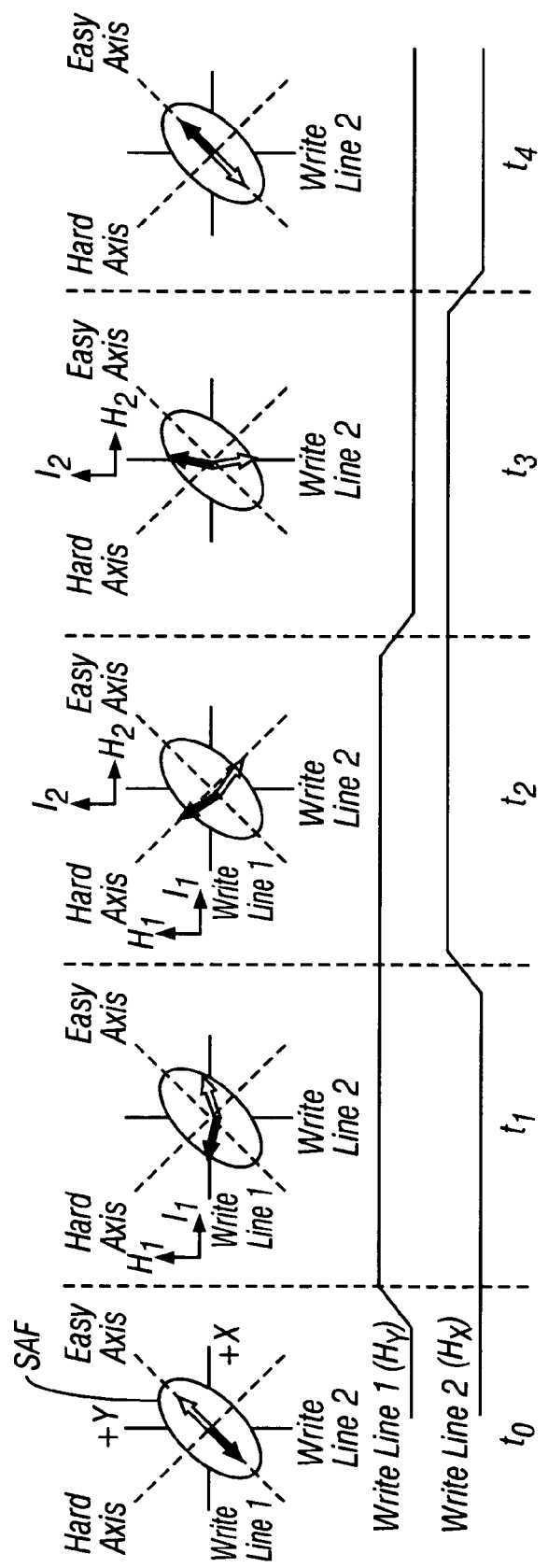
FIG. 4 illustrates the toggle write scheme for the prior art MTJ memory cell with a SAF free layer.

FIG. 4 illustrates the toggle write scheme for the MTJ cell with the SAF free layer. The SAF free layer has uniaxial magnetic anisotropy with its easy axis of magnetization oriented at 45 degrees from each of the two write lines. The SAF pinned layer is pinned with its magnetization direction aligned with the easy axis of the SAF free layer. The two stable magnetic states in the absence of an applied field are with the magnetization direction of the SAF free layer (shown by the solid arrow) either parallel or antiparallel to the magnetization direction of the SAF pinned layer, resulting in either a low or a high resistance, respectively.

As shown in FIG. 4, at time $t_1$ a positive current $I_1$, in the +X direction on WL1 generates an applied field $H_1$ in the +Y direction, causing the moments of both sublayers to rotate clockwise approximately 45 degrees. At time $t_2$ a positive current $I_2$ in the +Y direction on WL2 generates an applied field $H_2$ in the +X direction, which together with $H_1$ results in a net applied field at 45 degrees between the +X and +Y directions, causing the moments of both sublayers to rotate clockwise approximately another 45 degrees. At time $t_3$ the positive current $I_1$ is shut off, which results in just the field $H_2$ being applied in the +X direction, causing the moments of both sublayers to rotate clockwise approximately another 45 degrees. At this point, the moments of both sublayers have generally been rotated past their hard-axis instability points. At time $t_4$ the positive current $I_2$ is also shut off, which results in no fields being applied, causing the moments of both sublayers to rotate clockwise approximately another 45 degrees to the stable state aligned with the easy axis, but now rotated 180 degrees from the initial state. Thus, by sequentially switching the WL1 and WL2 currents on and off, the moments of the two sublayers are toggled in approximately 45 degree increments until the magnetization direction of the SAF free layer has been rotated 180 degrees. The toggle switching can also be achieved with a +X field applied at times $t_1$ and $t_2$ and a +Y field at times $t_2$ and $t_3$.

As shown in FIG. 4, if both currents are on, then the moments of the sublayers will align generally orthogonal to a 45 degree angle to the write lines, which is along the hard axis of magnetization. However, when only one current is on, the magnetic field will cause the moments of the sublayers to align generally parallel to a write line. In this toggle writing scheme only a single applied field along either the X or Y axis is present at half-selected cells. This single field is insufficient to switch the moments of the sublayers of the SAF free layers in the half-selected cells beyond their hard-axis instability points, so the magnetic states of the half-selected cells cannot be inadvertently switched when toggle writing to a selected cell.

The Invention

The invention is an MRAM similar to the above-described prior art MRAM, but with a multibit memory stack of memory cells in each intersection region, a toggle writing scheme for selectively writing a selected cell in the stack, and a read scheme for the multiple memory cells. The invention will be described first for an MRAM with a multibit memory stack of two stacked memory cells in each intersection region.

Figure 5:
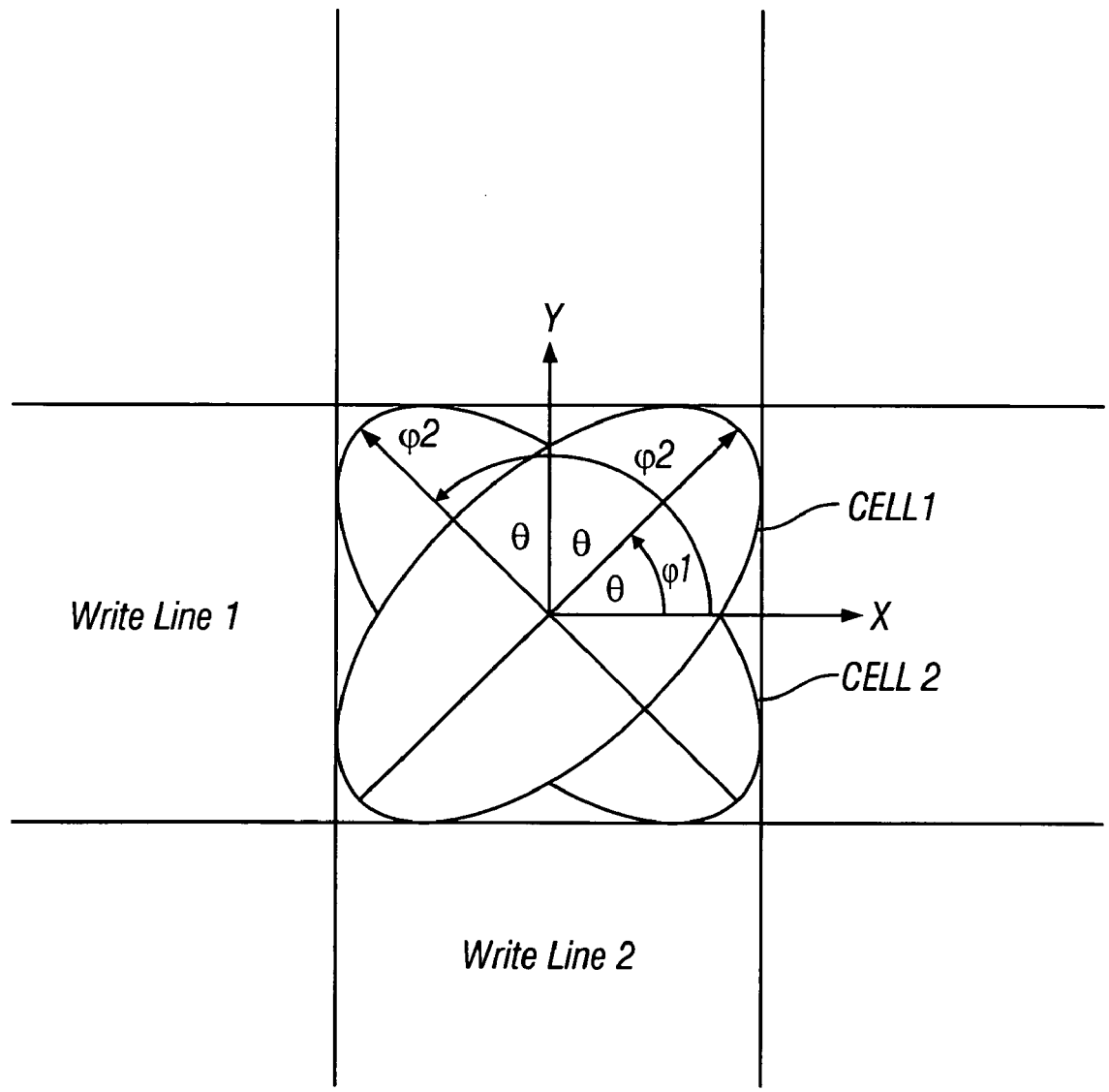
FIG. 5 is a top view of a multibit memory stack according to this invention having two MTJ cells and showing the orientation of their easy axes of magnetization relative to the write lines.

FIG. 5 is a top view of a multibit memory stack in an intersection region and having two MTJ cells 1 and 2, with cell 1 depicted on top of cell 2. The sign convention used herein is that a positive angle is measured counterclockwise (ccw) from the +X axis and a negative angle is measured clockwise (cw) from the +X axis. Thus cell 1 has its SAF free layer easy axis $\phi_1$ aligned +θ degrees (ccw) from the +X axis and cell 2 has its SAF free layer easy axis $\phi_2$ aligned (90+θ) degrees (ccw) from the +X axis. The angle θ is approximately 45 degrees so the easy axes of the two cells are angularly separated by approximately 2θ or 90 degrees. Each cell is depicted as having a generally elliptical shape, which is meant to represent that the cell's SAF free layer has shape anisotropy with the long axis being the easy axis ($\phi_1$ and $\phi_2$ for cells 1 and 2, respectively) and the short axis (the axis perpendicular to the long axis) being the hard-axis. Numerous other shapes besides the elliptical shape are possible to provide uniaxial anisotropy induced by the shape of the cell.

Figure 6:
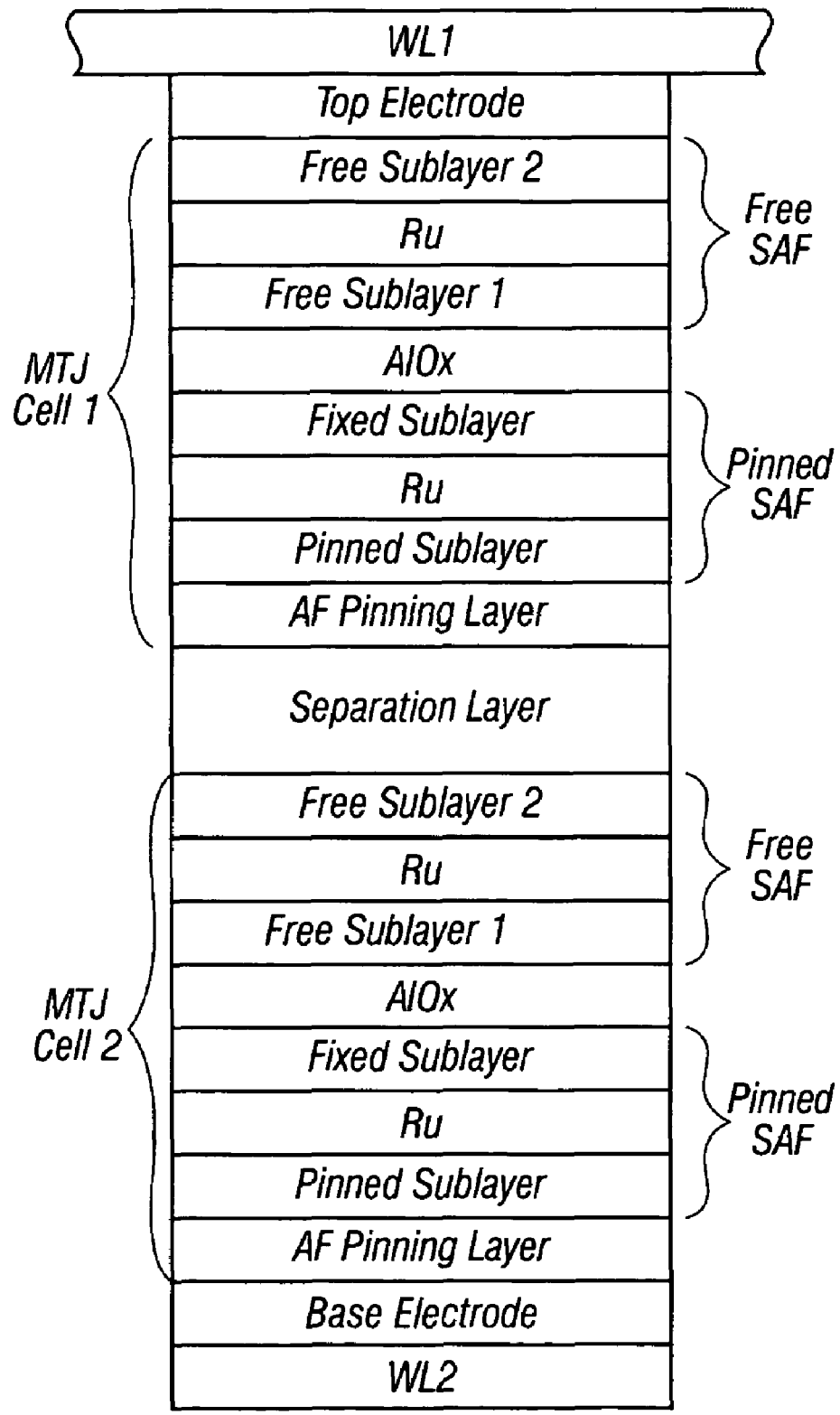
FIG. 6 is a sectional schematic showing the layers making up the two MTJ cells in the multibit memory stack according to this invention.

FIG. 6 is a sectional schematic showing the layers making up the two MTJ cells in the multibit memory stack. Each cell is substantially as described with respect to FIG. 2, but cell 1 is stacked on top of cell 2 with a nonmagnetic separation layer between the two cells. A relatively wide range of materials and thicknesses are known for use in MTJ memory cells, but representative examples are 2–4 nm of CoFe or CoFe/NiFe bilayers for the ferromagnetic sublayers in each SAF layer, 0.6 to 1.0 nm Ru for the antiferromagnetic coupling layer in each SAF layer, 5 to 10 nm IrMn for the AF pinning layer, and 0.5–3.0 nm alumina ($Al_2O_3$) for the tunnel barrier. While not depicted in FIG. 6, seed layers may be located beneath the AF pinning layers and a capping layer may be located beneath the top electrode. The nonmagnetic separation layer can be a material such as Cu or NiCu with a thickness of approximately 1 to 100 nm. The nonmagnetic separation layer provides electrical connection between the two cells while separating the SAF free layer of cell 2 from the AF pinning layer of cell 1. Because each of the SAF free and pinned layers have ferromagnetic sublayers with nearly balanced moments, there is no significant magneto-static coupling and, consequently, the nonmagnetic separation layer can be relatively thin. However, in the case of separate lithographic patterning processes used for the two cells, a thicker separation layer can be used to provide a process end-point buffer.

The fabrication of the multibit memory stack of FIG. 6 begins with the MRAM wafer having WL2 and the base electrode already formed on it. A suitable seed layer is deposited on the base electrode layer, followed by deposition of the AF pinning layer, the first pinned sublayer, the Ru AFC layer and the second pinned sublayer. The tunnel barrier of MTJ cell 2 is then formed by deposition of an aluminum film, followed by oxidation to form the alumina tunnel barrier. The first free sublayer, the Ru AFC layer, the second free sublayer and the nonmagnetic separation layer are then deposited on the tunnel barrier. The layers forming both the SAF pinned layer and the SAF free layer in MTJ cell 2 are deposited in the presence of a magnetic field aligned with easy axis $\phi_2$ of cell 2, which defines the overall magnetization direction of cell 2, including the magnetization direction of the AF pinning layer. The wafer is then annealed without the presence of a magnetic field at temperatures around 200 to 300° C. to improve the temperature dependence of the exchange coupling. Next the wafer is lithographically patterned and etched to define the shape of MTJ cell 2, and thereby form its uniaxial shape anisotropy. After the patterning, etching and resist removal, an insulating material, such as alumina, is used to refill the areas removed by etching. This is followed by a chemical-mechanical polishing (CMP) process to planarize the wafer and expose the nonmagnetic separation layer. This completes the process for the MTJ cell 2. The process for fabricating MTJ cell 1 on top of the separation layer is essentially the same as for MTJ cell 2 except that the deposition occurs in a magnetic field aligned with the easy axis $\phi_1$ of cell 1. The process described above results in MTJ cells with the SAF pinned layer located below the tunnel barrier, but one or both of the MTJ cells in the stack can be formed with the SAF free layer located below the tunnel barrier.

FIGS. 5 and 6 depict the write lines directly above and below the cells and aligned with the X and Y axes. However, each write line can be a pair of write lines spaced on the sides of the stack, near the top and bottom of the stack, with the memory cells located in the intersection region between the top and bottom pairs of write lines. Thus write line 2 can be a pair of write lines spaced on the sides of the base electrode (FIG. 6) and aligned parallel to the Y axis and write line 1 can be a pair of write lines spaced on the sides of the top electrode and aligned parallel to the X axis. Write current directed along both lines in a pair will generate a magnetic field substantially in the planes of the free layers in the stack.

An alternative fabrication process for the multibit memory stack does not rely on shape anisotropy of the cells and thus reduces the number of process steps and manufacturing cost. It is known that uniaxial anisotropy of the ferromagnetic free layer can be defined with the applied magnetic field during the deposition. The magnitude of the anisotropy can be quite high in certain materials such as CoFeB and CoFeHf. Also, it has been reported by Pugh et al, *IBM Journal of Research &Development*, Vol. 4, No. 2, p. 163 (1960), that high uniaxial anisotropy can be obtained in NiFe by controlling the angular incident angle in an ion beam deposition or evaporator system. By orienting the wafer relative to the magnetic field direction and/or the incident beam angle, the anisotropy angle can be defined by deposition rather than by lithographic patterning. In this case the multibit memory stack can be deposited in a single pump-down while achieving different controlled anisotropy directions for the SAF free layers and corresponding magnetization directions for the SAF pinned layers. If the uniaxial anisotropy of the cells is defined by a material deposition scheme, such as angular incidence, the cells can have the same shape and matching perimeters that are aligned in the Z-direction. One example would be circular-shaped cells. The uniaxial anisotropy directions for cells 1 and 2 are defined by depositing the SAF free layers for cells 1 and 2 at different angular incident angles. With this fabrication approach, both cells can be fabricated with the same lithographic patterning steps. A circular geometry also allows the cells to be packed closer together in the X-Y plane.

Figure 7A:
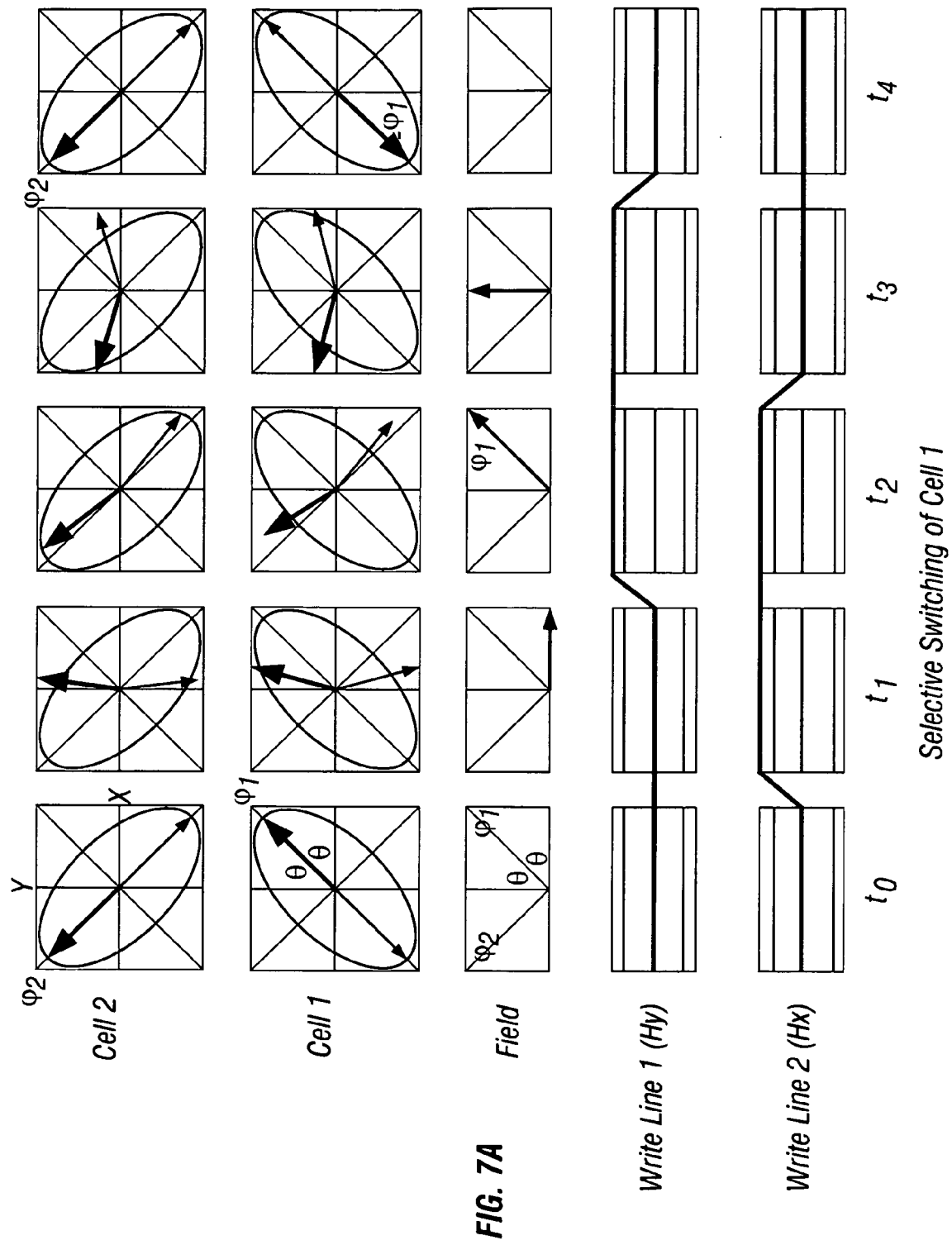
FIG. 7A illustrates the toggle write scheme for writing MTJ cell 1 without writing MTJ cell 2 in the MRAM of this invention.

FIG. 7A illustrates the toggle write scheme for selective writing of MTJ cell 1 without switching MTJ cell 2. Assume that the initial magnetization directions of the SAF free sublayer 1 at time $t_0$ for cells 1 and 2 are in the $\phi_1$ and $\phi_2$ directions, respectively (see FIG. 5). At time $t_1$ a positive current in WL2 in the +Y direction generates an applied field $H_X$ in the +X direction, causing the magnetization directions in cells 1 and 2 to be aligned essentially along the Y axis. At time $t_2$ equal positive current are flowing in WL1 and WL2 which generates a net applied field oriented at +45 degrees (ccw from the +X axis) and causing the magnetization directions of cells 1 and 2 to be aligned close to −45 degrees and close to +135 degrees, respectively. At time $t_3$ the positive current in W2 is shut off, which results in just the field $H_Y$ being applied in the +Y direction, causing the magnetization directions of cells 1 and 2 to be aligned essentially along the X axis. At this point, the magnetization direction of cell 1 has rotated past its hard-axis instability point, but the magnetization direction of cell 2 has not. At time $t_4$ the positive current in WL1 is also shut off, which results in no fields being applied, the magnetization direction of cell 1 has already rotated past the hard-axis of cell 1 and thus proceeds to the new orientation ($-\phi_1$) and completes the switching. The magnetization direction of cell 2 did not rotate past the hard-axis of cell 2 and thus rotates back to its original and unchanged state ($+\phi_2$). Therefore, after applying the write scheme described above, the magnetization direction of cell 1 is switched but the magnetization direction of cell 2 has not switched, thus demonstrating the selective writing with this invention. The same result of FIG. 7A can be achieved with a +Y field applied at times $t_1$ and $t_2$ and a +X field at times $t_2$ and $t_3$.

Figure 7B:
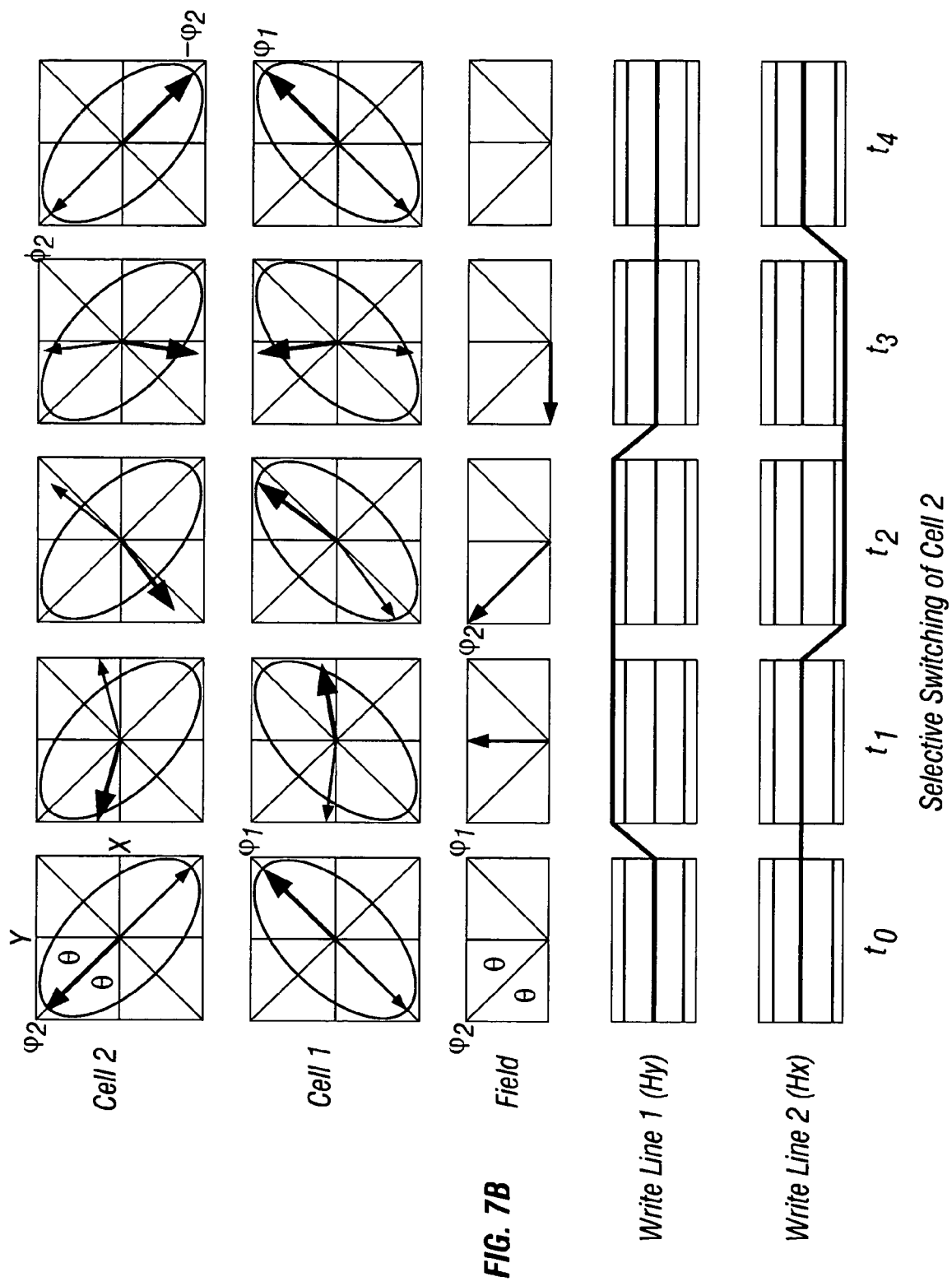
FIG. 7B illustrates the toggle write scheme for writing MTJ cell 2 without writing MTJ cell 1 in the MRAM of this invention.

FIG. 7B illustrates the toggle write scheme for writing MTJ cell 2 without writing MTJ cell 1. The switching of cell 2 without switching cell 1 can be achieved by applying overlapping fields in the +Y and −X directions, which requires a positive current in WL1 and a "negative" current in WL2, i.e., a current in the direction opposite to the current in WL2 in FIG. 7A. At time $t_3$ the magnetization direction of cell 2 is close to −90 degrees and has rotated past the hard-axis of cell 2 so that it rotates to its closest easy-axis direction ($-\phi_2$) when the field is removed at time $t_4$, thus completing the switching of cell 2. However, because the magnetization direction of cell 1 is close to +90 degrees and has not rotated past its hard-axis at time $t_3$, it returns back to its original state ($+\phi_1$) when the field is removed at time $t_4$ and thus cell 1 is not switched.

Each MTJ cell in the two-bit stack can be a "1" or a "0", so there are four possible magnetic states for the stack. These states are represented by (cell 1 state, cell 2 state) as (1,1), (1,0), (0,1) and (0,0). If the two cells have the same resistance difference, $\Delta R$, between the "1" and "0" states, a conventional comparator can only detect 3 resistance levels instead of the 4 needed. However, by fabricating cell 1 and cell 2 with different MTJ materials so that the cells have different $\Delta R$ values, four distinguishable resistance levels can be detected. For example, if $\Delta R$ of cell 1 is at least twice the $\Delta R$ of cell 2 the four states can be determined from the four net resistance levels, with the highest resistance being (1,1) followed by (1,0), (0,1) and (0,0). Published patent application US20020036331A1 describes an MRAM with a memory cell of two stacked conventional MTJ cells in which the ferromagnetic layers in the cells have different coercivities so that the cells have different $\Delta R$ values. The logic state of this two-bit memory cell is read by applying a voltage across the memory cell and determining the magnitude of a sense current that flows through the memory cell, with the magnitude of the sense current being proportional to the total resistance of the two series-connected MTJ cells. Different $\Delta R$ values of the two MTJs cells can also be achieved by fabricating the cells with different tunnel barrier thicknesses. This is readily achievable because the resistance-area product (RA) for magnetic tunnel junctions can be made to span 2–3 orders of magnitude for a given barrier material. For example, while the typical MTJ cell for an MRAM has a RA of approximately 1 k$\Omega$ $\mu m^2$ the typical MTJ for a magnetoresistive sensor for recording head applications has RA well below 5 $\Omega \mu m^2$. The advantage of making the cells have different $\Delta R$ values by varying the tunnel barrier thickness is that the magnetic properties of the SAF free layers for the two MTJ cells can still be made nearly the same.

While the invention has been described wherein the multibit memory stack has two stacked memory cells, the invention is applicable to N stacked memory cells, where N is 2 or more. Each of the N cells in the stack has a uniquely aligned uniaxial anisotropy axis (the easy axis) for its SAF free layer. Preferably the anisotropy axes of the N cells are equally angularly spaced apart by approximately 2θ, where θ is also the half-angle between the anisotropy axes. If the anisotropy axes are not equally angularly spaced, the angle θ is chosen to be less than or equal to β/2, where β represents the minimum angular separation of the anisotropy axes in the cells in a multibit memory stack. To minimize the half-select cell disturbance, none of the easy axes are aligned perpendicularly to the write lines, i.e., the X and Y axes in the typical cross point MRAM architecture. The optimum case is achieved when the anisotropy axis closest to the +X axis is at +θ degrees.

Selective writing of an individual selected cell in the N-cell stack is achieved by generating a write field in three pre-set directions using the two write lines. Each of the three current magnitudes ($I_k$, where k=1, 2 and 3) is high enough to generate a field sufficient to rotate the SAF free layer magnetization in a nearly perpendicular direction to the applied field, i.e., the spin-flop mode. During phase $t_1$, the applied field is set in the ($\phi_j - \theta$) direction, or at an angle $-\theta$ (cw) from the easy axis $\phi_j$ of the selected cell (cell j). During phase $t_2$, the field is set parallel to the easy axis $\phi_j$. Finally, during phase $t_3$, the field is set in the ($\phi_j + \theta$) direction, or at an angle +θ (ccw) from the selected easy axis $\phi_j$. The relative pre-set current magnitudes at the $t_1$, $t_2$ and $t_3$ phases in write line 2 (field $H_X$) and write line 1 (field $H_Y$), respectively are as follows:

$$[I_1\mathrm{Cos}(\phi_j - \theta), I_1\mathrm{Sin}(\phi_j - \theta)]$$

$$[I_2\mathrm{Cos}(\phi_j), I_2\mathrm{Sin}(\phi_j)]$$

$$[I_3\mathrm{Cos}(\phi_j + \theta), I_3\mathrm{Sin}(\phi_j + \theta)]$$

During the write pulses the selected cell's free layer magnetization will rotate ccw during the write phases $t_1$, $t_2$ and $t_3$ by angles of approximately (90−θ), θ and θ respectively, resulting in a net ccw rotation of (90+θ) degrees. At the end of the write pulses the magnetization direction of the selected cell will have rotated past its hard-axis by approximately θ degrees and will continue to rotate to the easy-axis direction 180 degrees from its initial direction. For each of the other cells in the multibit memory stack, since its free layer magnetization direction never rotates closer to its hard-axis by an angle θ, its magnetization direction returns to its initial magnetization direction and its magnetic state is not switched.

For the N=2 case described above, the $\phi_1$ and $\phi_2$ are +45 and +135 degrees respectively and θ equals 45 degrees. For convenience in designing the write circuit, instead of $I_1 = I_2 = I_3$ $I_2$ can be chosen to be the square root of 2 (1.4) times that of $I_1$ and $I_3$, resulting in two single magnitude pulses for current along the X and Y axes as can be seen in FIGS. 7A–7B.

Figure 8:
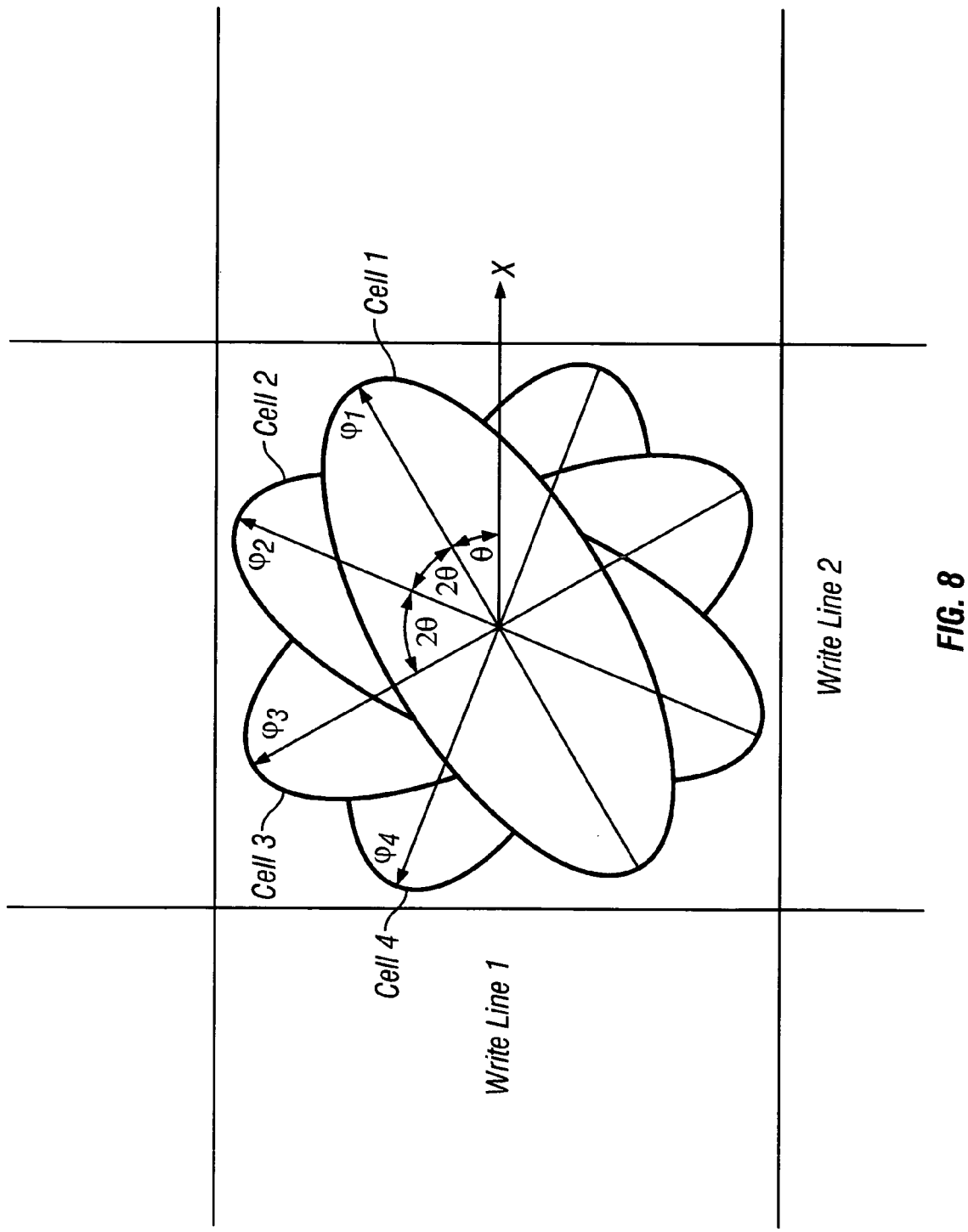
FIG. 8 is a top view of a multibit memory stack according to this invention having four MTJ cells and showing the orientation of their easy axes of magnetization relative to the write lines.

FIG. 8 is a top view of an N-cell memory stack with N=4, with cell 1 depicted as the top cell and cell 4 as the bottom cell. The easy axis $\phi_j$(j=1 to 4) for each cell is evenly separated by 45 degrees apart (θ=22.5 degrees) from the easy axes of the cells immediately above and below it.

Figure 9A:
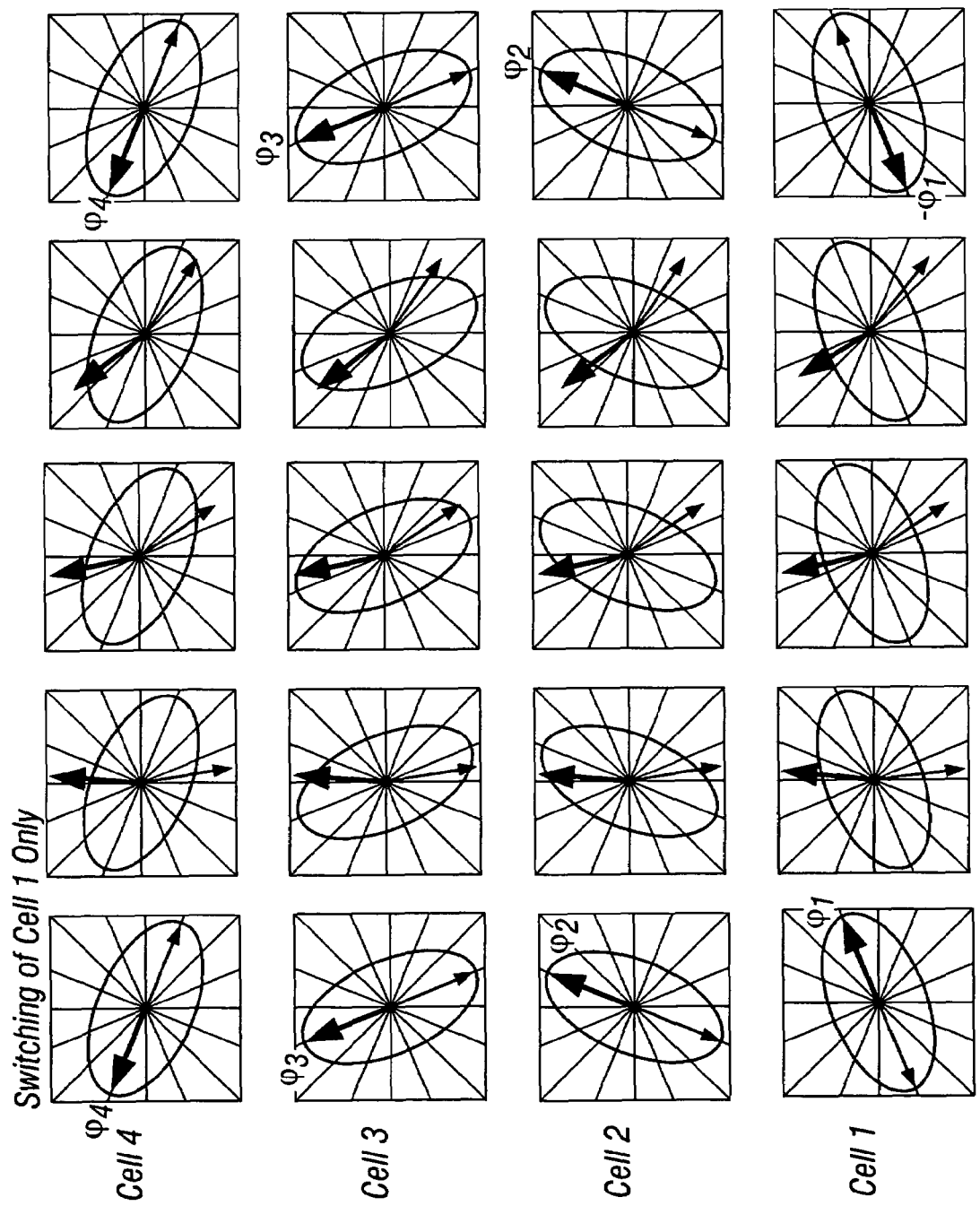
FIGS. 9A–9D illustrate the toggle write scheme for selectively writing each of the four MTJ cells, respectively, in the multibit memory stack of FIG. 8.
Figure 9A:
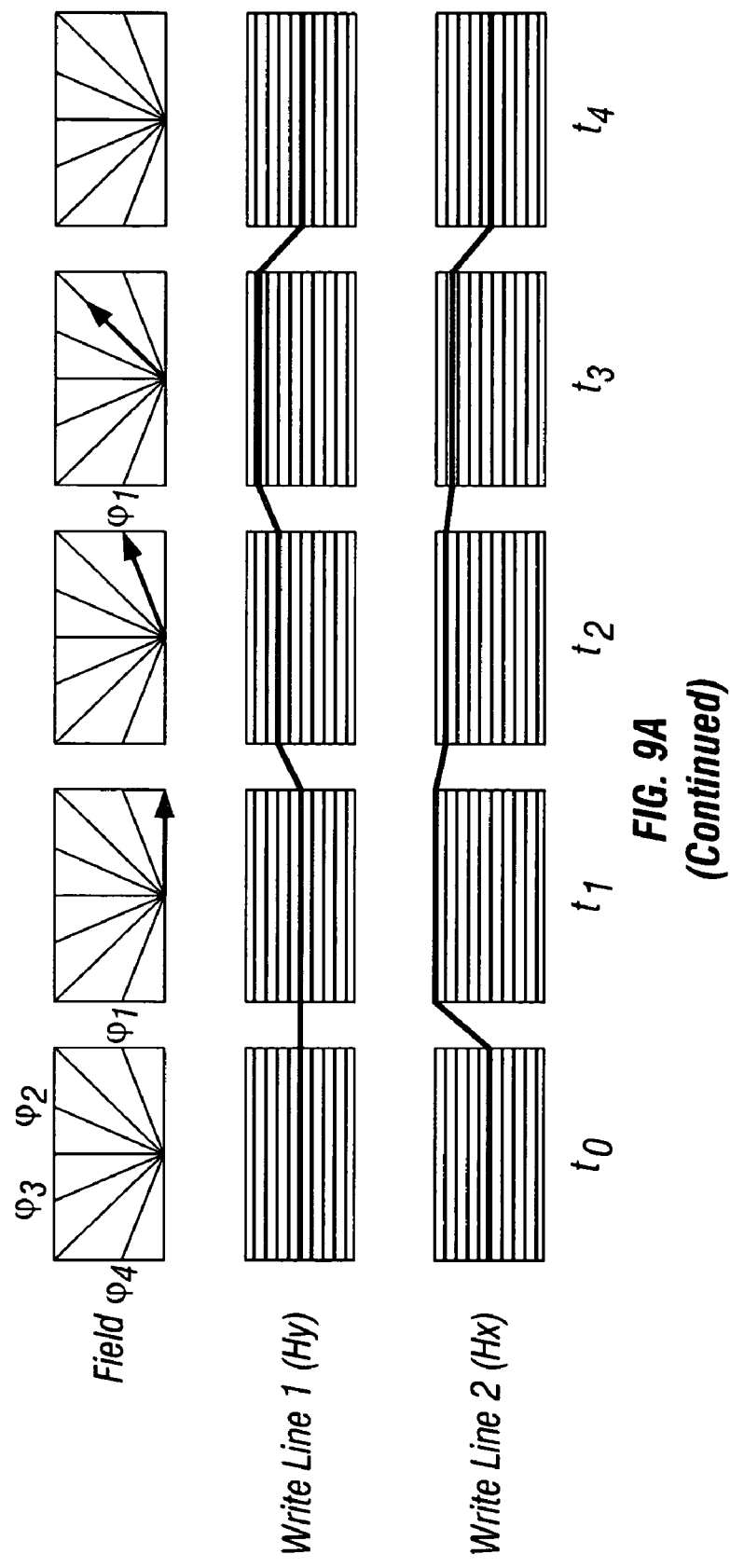
Figure 9B:
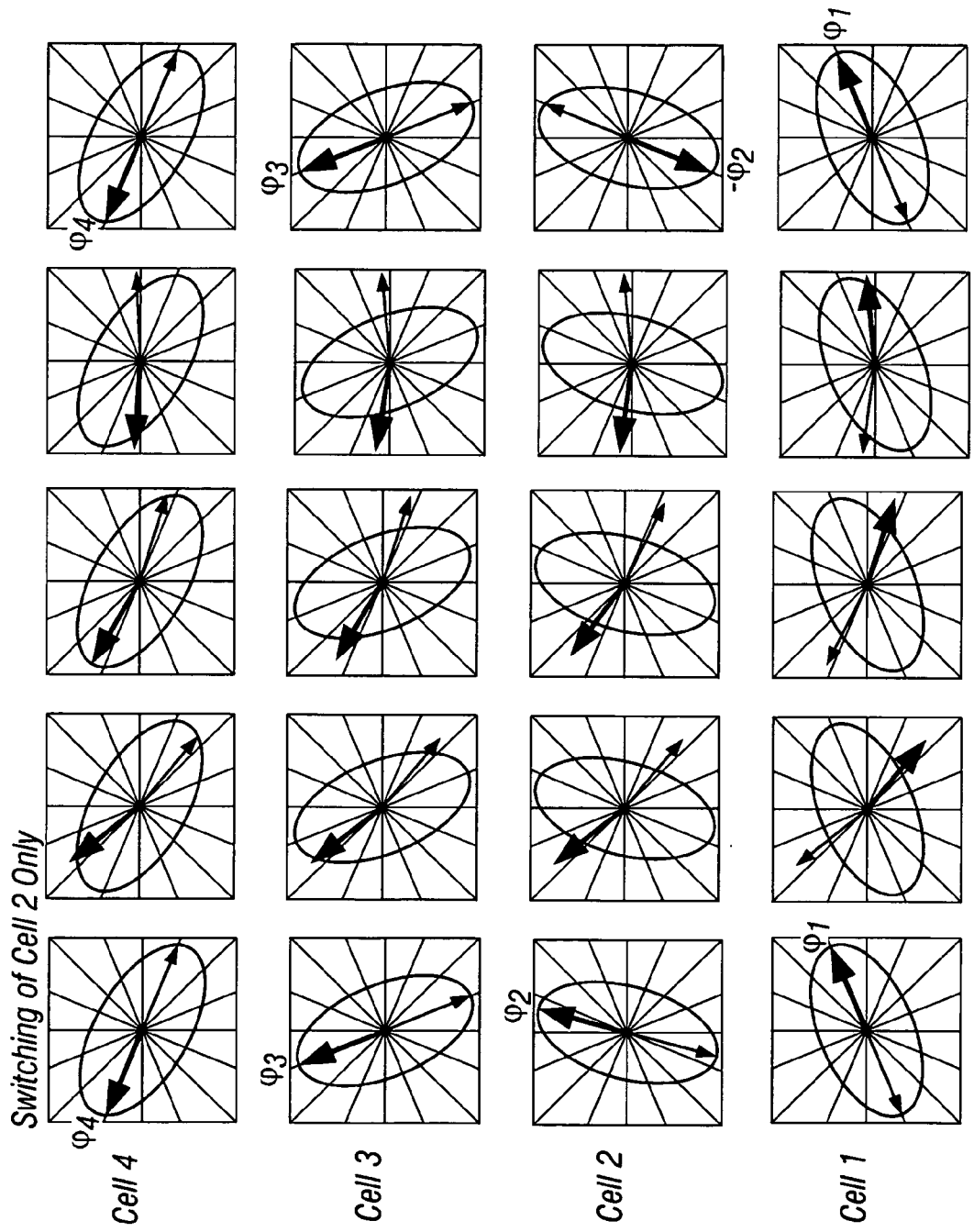
Figure 9B:
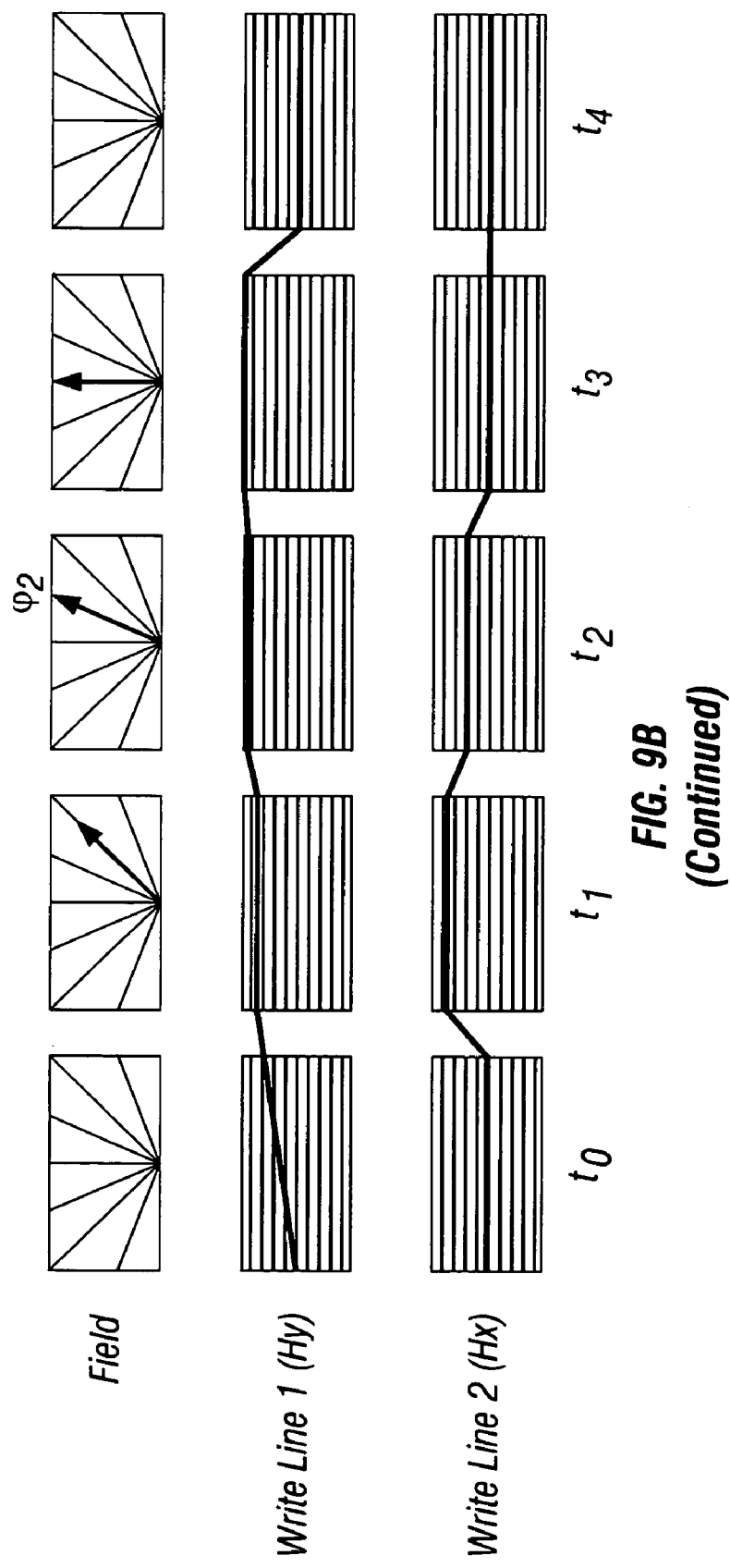
Figure 9C:
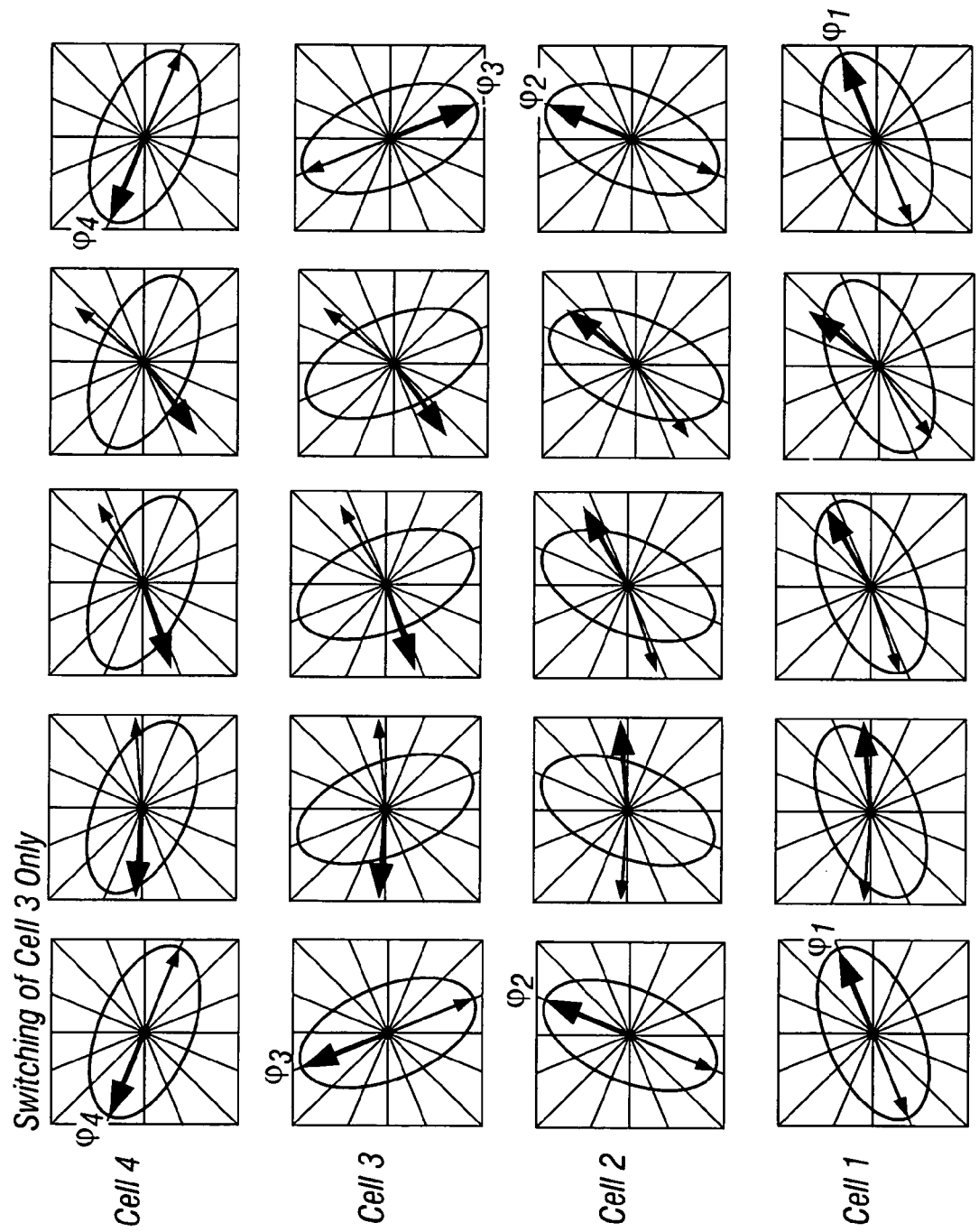
Figure 9C:
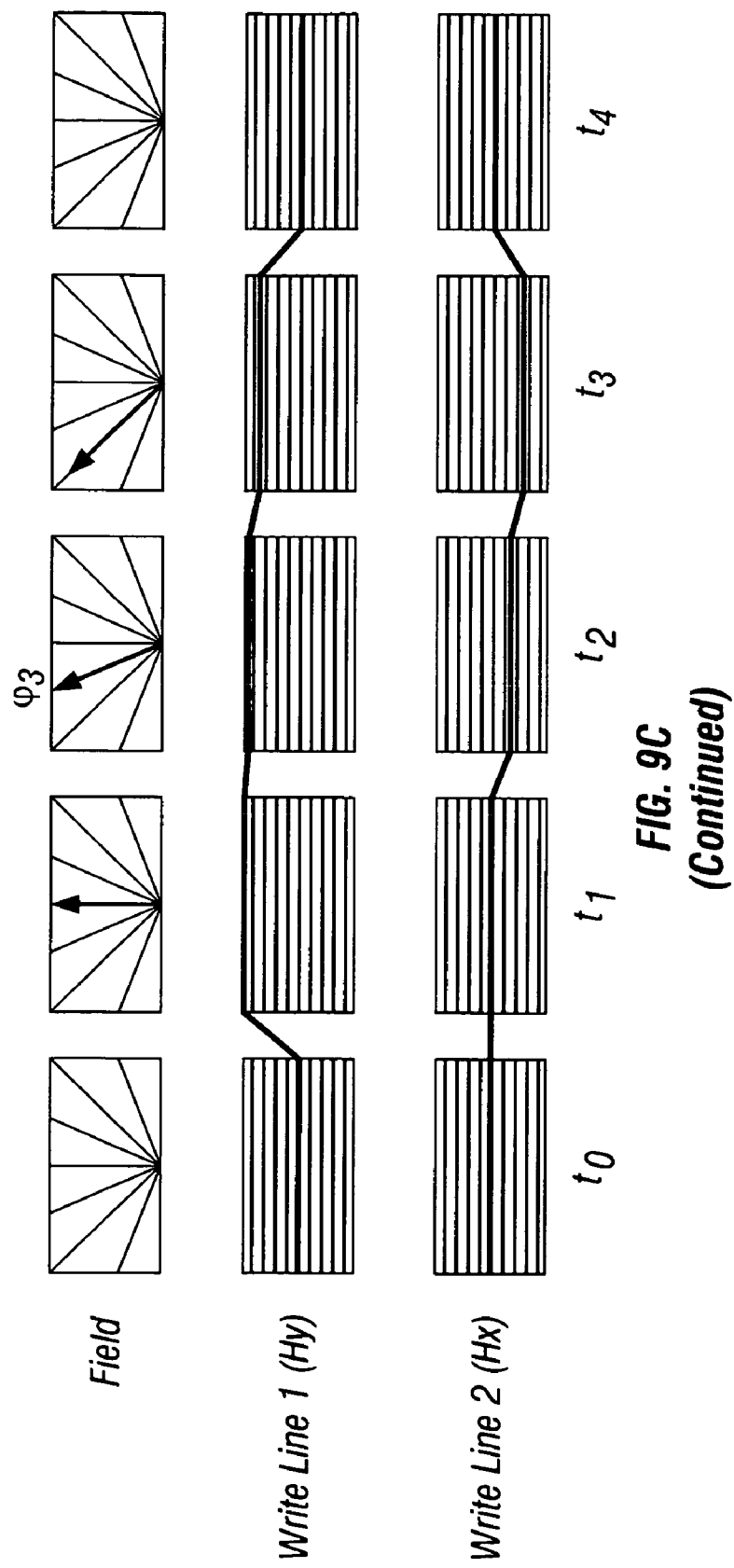
Figure 9D:
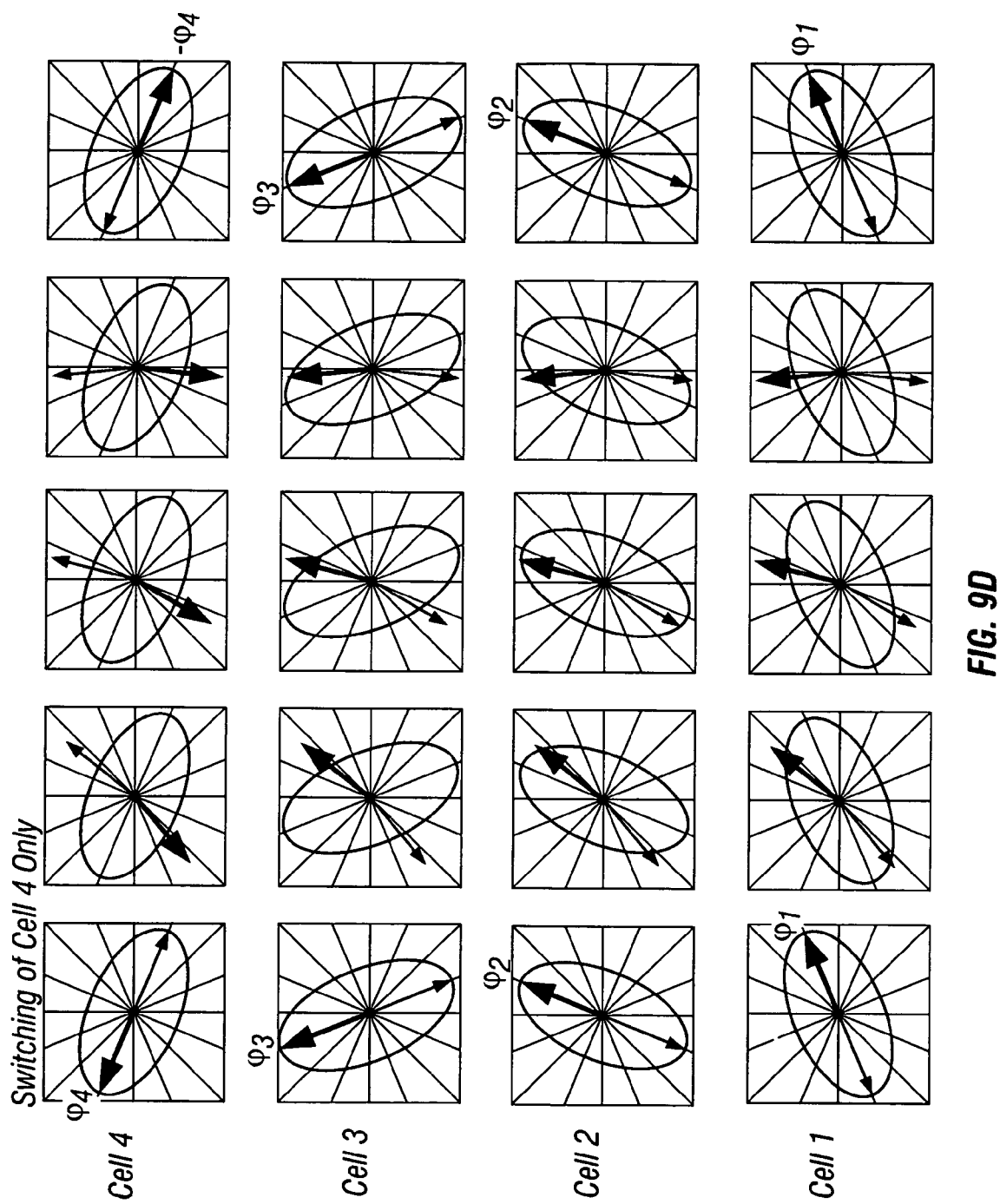
Figure 9D:
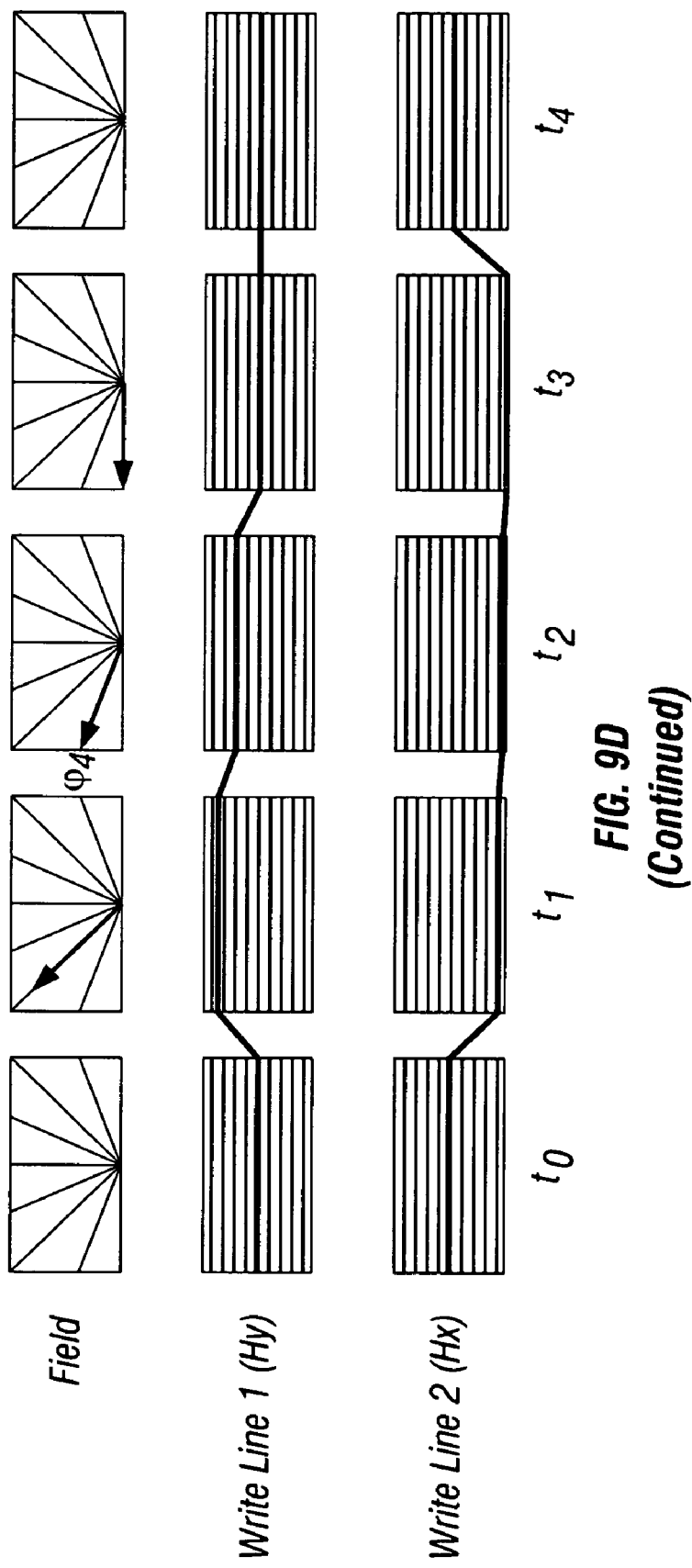

FIGS. 9A–9D illustrate the toggle write scheme for selectively writing each of the four MTJ cells in the stack of FIG. 8. The four cells 1–4 have their easy axes oriented at 22.5, 67.5, 112.5 and 157.5 degrees ccw, respectively, from the +X axis. The easy axes are evenly spaced at β=2θ=45 degrees. The selective switching of cell 1 is shown in FIG. 9A. In phase $t_0$, the initial magnetization directions of cells 1, 2, 3 and 4 are in their respective stable easy-axis orientations ($\phi_1$, $\phi_2$, $\phi_3$, and $\phi_4$, respectively). For convenience, $I_1 = I_2 = I_3$. In phase $t_1$, the net field is in the ($\phi_1 - \theta$) direction, i.e., along the +X axis, with write currents in WL1, WL2 of 0 and $I_1$, respectively. The three magnetization directions rotate ccw to the closest perpendicular direction from the +X field, in this case near 90 degrees from the X axis. There are minor deviations in angles as a result of anisotropy differences among the cells. In phase $t_2$, the write field is in the $\phi_1$ direction at +22.5 degrees with corresponding write in WL1, WL2 of 0.38 $I_2$ and 0.92 $I_2$, respectively. The magnetization directions of the cells align close to 90 degrees from the applied field direction and are at angle slightly less than 112.5 degrees. In phase $t_3$, the write field is in the ($\phi_1 + \theta$) direction at 45 degrees and the corresponding write currents in WL1, WL2 are 0.71 $I_3$ and 0.71 $I_3$, respectively. The magnetization directions of the cells are aligned close to the 135 degree angle. In phase $t_4$, the current in both write lines WL1 and WL2 is switched off and there is no applied field. At this point, the magnetization direction of cell 1 has rotated past its hard axis and thus rotates to the new direction ($-\phi_1$), which is 180 degrees from its initial direction (+$\phi_1$) to complete the switching. The magnetization direction of cell 2, 3, and 4 did not rotate past their hard axes, and thus rotates back to its original direction. In a similar manner, as illustrated in FIGS. 9B, 9C and 9D, the magnetic states of cells 2, 3 and 4 can be switched respectively without switching the magnetic states of the other cells in the stack by using a three phase current or magnetic field pulse at orientation of ($\phi_i - \theta$), $\phi_i$, ($\phi_i + \theta$).

For toggle writing in a prior art Savatchenko type MRAM that has only a single memory cell in each intersection region, write current of only a single polarity and a single magnitude is sufficient for each write line. In the MRAM according to the present invention, that has a multibit memory stack of two stacked memory cells in each intersection region (N=2), the write circuitry must be able to provide bidirectional current on at least one of the write lines. When there are four stacked memory cells (N=4), then to achieve selective writing of each of the cells in the stack the write circuitry must be able to provide bidirectional current on at least one of the write lines and three levels of current magnitude on each write line.

Selective reading of a selected cell in the multibit memory stack can be accomplished by measuring the resistance across the stack of cells, selectively write toggling the selected cell to be read (as described above), measuring the resistance across the stack of cells, and then writing the selected cell back to its original state. The increase or decrease in the two measured resistances indicates the state of the selected cell. Published patent application US20040125649A1 describes a method for reading a selected cell in a single-memory-layer toggling MRAM that has each cell associated with its own write lines but multiple cells in the single layer connected in series to a single transistor. The reading of the selected cell occurs by measuring the resistance of the series-connected cells before and after toggle writing the selected cell.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic random access memory (MRAM) comprising:
    a substrate generally parallel to an X-Y plane of an X-Y-Z coordinate system;
    a plurality of memory cell stacks on the substrate, each memory cell stack extending from the substrate along the Z axis and comprising:
        N memory cells, where N is three or more, each memory cell comprising a pinned ferromagnetic layer, a synthetic antiferromagnetic (SAF) free layer with an easy axis of magnetization aligned in an X-Y plane and nonparallel to the X and Y axes, and a nonmagnetic coupling layer between the pinned and free layers, the free layer having a switchable magnetization direction aligned generally parallel or antiparallel with the magnetization direction of the pinned layer, wherein the easy axes of magnetization of all N free layers are generally equally angularly spaced by an angle $2\theta$ about the Z axis and the easy axis of magnetization of the free layer aligned closest to the X axis is angularly spaced from the X axis by an angle approximately equal to $\theta$, the angle $\theta$ being approximately 90 degrees/N; and
        a nonmagnetic separation layer between adjacent memory cells in the stack.

2. The MRAM of claim 1 further comprising:
    a plurality of first electrically conductive lines substantially parallel to the X axis;
    a plurality of second electrically conductive lines substantially parallel to the Y axis; and
    write circuitry coupled to the first and second lines for directing electrical current to the first and second lines.

3. The MRAM of claim 2 wherein the write circuitry provides bidirectional current on each of the first and second lines.

4. The MRAM of claim 2 wherein the write circuitry is capable of providing three levels of current magnitude on each of the first and second lines.

5. The MRAM of claim 1 wherein the pinned layer in each cell is a SAF pinned layer.

6. The MRAM of claim 1 wherein each of the cells is a magnetic tunnel junction (MTJ) cell and wherein each nonmagnetic coupling layer is a tunnel barrier.

7. The MRAM of claim 1 wherein the easy axis of magnetization of the SAF free layer in each cell is the axis of anisotropy induced by the shape of the cell.

8. The MRAM of claim 7 wherein each cell has a generally elliptical shape with the axis of anisotropy being aligned with the long elliptical axis.

9. The MRAM of claim 1 wherein the easy axis of magnetization of the SAF free layer in each cell is the axis of anisotropy induced during deposition of the SAF free layer, and wherein the N cells in each stack have the same shape and matching perimeters.

10. The MRAM of claim 9 wherein each cell has a generally circular shape.

11. The MRAM of claim 1 wherein each cell in a stack has an electrical resistance difference $\Delta R$ between the parallel and antiparallel alignment of its free and pinned layer magnetization directions, and wherein the $\Delta R$ of the each cell is substantially different from the $\Delta R$ of the other cells in its stack.

12. The MRAM of claim 11 wherein each cell is a magnetic tunnel junction (MTJ) cell and each nonmagnetic coupling layer is a tunnel barrier, and wherein the tunnel barrier thickness of the each MTJ cell is substantially different from the tunnel barrier thickness of the other MTJ cells in its stack.

13. The MRAM of claim 1 further comprising a plurality of transistors on the substrate, and wherein each stack is electrically connected to a transistor.

14. The MRAM of claim 13 further comprising read circuitry coupled to the transistors for detecting the electrical resistance across the stacks.

15. A method for switching the magnetization direction of the free layer in a selected memory cell without switching the magnetization directions of the free layers in the other memory cells in a memory cell stack of the MRAM of claim 1, the method comprising:
    applying a first magnetic field in an X-Y plane along a line approximately $-\theta$ degrees about the Z axis from the initial magnetization direction of the free layer of the selected cell;
    applying a second magnetic field in an X-Y plane along a line generally aligned with initial magnetization direction of the free layer of the selected cell; and
    applying a third magnetic field in an X-Y plane along a line approximately $+\theta$ degrees about the Z axis from the initial magnetization direction of the free layer of the selected cell; whereby after application of the third magnetic field, the magnetization direction of the free layer of the selected cell has been switched from its initial magnetization direction.

16. A method for switching the magnetization direction of the free layer in a selected memory cell without switching the magnetization directions of the free layers in the other memory cells in a memory cell stack of the MRAM of claim 2, wherein the angular spacing of the easy axis of magnetization of the free layer of the selected cell from the X axis as measured counter-clockwise about the Z axis is denoted by $+\phi$, the method comprising:
    directing first write currents along the X-axis line with a magnitude of $I_1 \cos(\phi-\theta)$ and along the Y-axis line with a magnitude of $I_1 \sin(\phi-\theta)$;
    directing second write currents along the X-axis line with a magnitude of $I_2 \cos(\phi)$ and along the Y-axis line with a magnitude of $I_2 \sin(\phi)$; and
    directing third write currents along the X-axis line with a magnitude of $I_3 \cos(\phi+\theta)$ and along the Y-axis line with a magnitude of $I_3 \sin(\phi+\theta)$; wherein $I_1$, $I_2$ and $I_3$ are not equal.

* * * * *